United States Patent [19]

Halemane et al.

[11] Patent Number: 5,029,297

[45] Date of Patent: Jul. 2, 1991

[54] OPTICAL AMPLIFIER-PHOTODETECTOR DEVICE

[75] Inventors: Thirumala R. Halemane, Howell; Thomas L. Koch, Holmdel; Steven K. Korotky, Toms River, all of N.J.

[73] Assignee: AT&T Bell Laboratories, Murray Hill, N.J.

[21] Appl. No.: 421,217

[22] Filed: Oct. 13, 1989

[51] Int. Cl.[5] ............................ G02B 6/10; H01S 3/10
[52] U.S. Cl. ......................................... 330/4.3; 357/19
[58] Field of Search ........................ 330/4.3; 250/205; 357/19, 30; 455/610; 350/96.11, 96.19; 372/50

[56] References Cited

U.S. PATENT DOCUMENTS

| | | | |
|---|---|---|---|
| 3,902,133 | 8/1975 | Watts | 372/50 |
| 4,438,447 | 3/1984 | Copeland et al. | 357/30 |
| 4,470,143 | 9/1984 | Kitamura et al. | 372/50 |
| 4,484,144 | 11/1984 | Nakagome et al. | 330/4.3 |
| 4,653,058 | 3/1987 | Akiba et al. | 372/50 |
| 4,692,207 | 9/1987 | Bouadma et al. | 372/50 |
| 4,747,650 | 5/1988 | Sakuda | 330/4.3 |
| 4,847,665 | 7/1989 | Mand | 357/19 |
| 4,847,846 | 7/1989 | Sone et al. | 372/50 |
| 4,938,556 | 7/1990 | Digonnet et al. | 330/4.3 |
| 4,947,134 | 8/1990 | Olsson | 330/4.3 |

OTHER PUBLICATIONS

Dulta et al., "Monolithoically Integrated Laser/-Photodetector", Elect. Letters, vol. 24, #6, 3/17/88, pp. 335-336.

Bouadma et al., "GaAs/AlGaAs Ridge ... Etching", Elect. Lett., vol. 23, #16, 7/30/87, pp. 855-857.

Grudin et al., "Effect of ... Coupled Waveguides", Sov. Microelectron, vol. 15, #1, pp. 59-61, 2/86, Abst. only.

Dance et al., "The Road to Integrated ... Circuits", Elektronic (Netherlands), vol. 33, No. 15-16, pp. 11-33, 8/23/85.

*Primary Examiner*—Nelson Moskowitz
*Attorney, Agent, or Firm*—Eli Weiss

[57] ABSTRACT

The device here disclosed comprises an optical amplifier coupled to direct optical energy into a passive waveguide for transmission through the waveguide to its other end. A photodetector, positioned relative to the passive waveguide, detects the presence of optical energy in the passive waveguide. The photodetector in the structure illustrated is positioned downstream from the optical amplifier and spatially positioned with respect to the optical amplifier to receive optical energy only from the waveguide. The photodetector does not receive optical energy directly from the optical amplifier. A small fraction of the optical energy carried by the passive waveguide is received and detected by the photodetector.

2 Claims, 1 Drawing Sheet

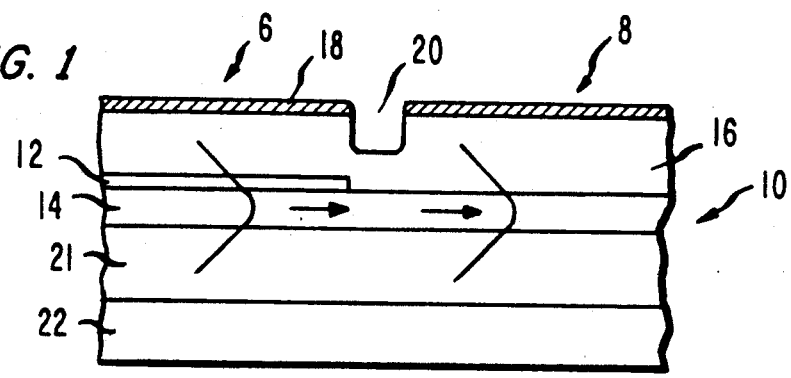
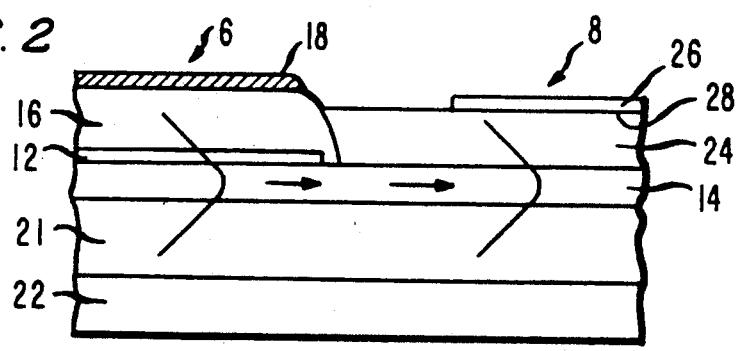
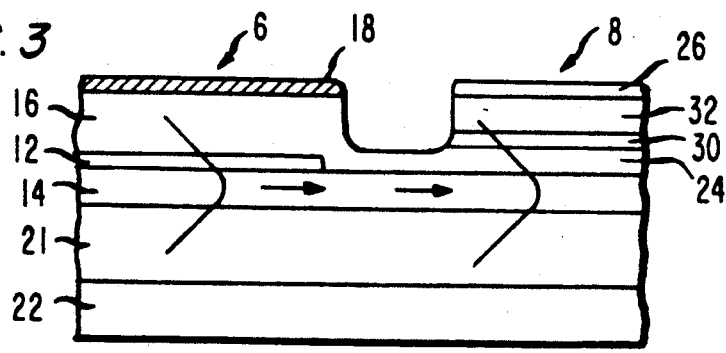
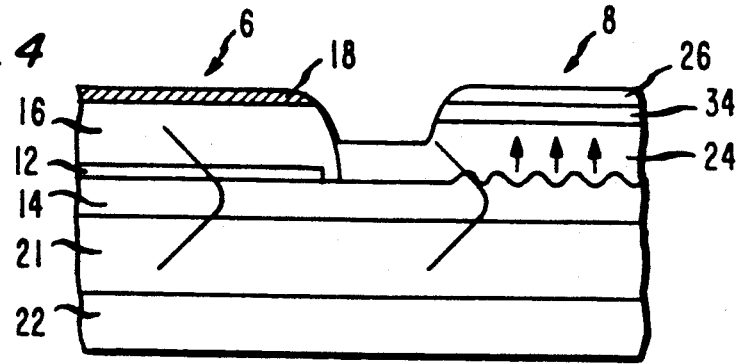

OPTICAL AMPLIFIER-PHOTODETECTOR DEVICE

TECHNICAL FIELD

This invention relates to the field of optical amplifiers and, more particularly to an optical amplifier and a monitoring detector integrated on a common wafer.

BACKGROUND OF THE INVENTION

Optical amplifiers are contemplated for use in long-haul optical fiber transmission systems where the information which is being transmitted is in the form of an encoded beam of light which propagates through a glass fiber. To obtain error-free transmission, the intensity of the transmitted light beam must be maintained within a specific allowable range. Current methodology would employ a monitoring photodetector which is physically separate from the optical amplifier to detect and measure the power output of the optical amplifier. In operation, the monitoring detector measures the average power output of the optical amplifier. The signal from the monitoring detector, acting through a feedback circuit, is employed to adjust the amplification of the optical amplifier to maintain the average power output of the optical amplifier to be within the range desired. This adjustment of the optical amplifier is required because the power output of the optical amplifier can experience a slow change or drift during operation as a result of a gradual degradation of its operating characteristics; or as a result of a variation of the degradation of its operating characteristics; or as a result of a variation of the ambient temperature.

Currently, the power output of an optical amplifier is measured by diverting a portion of the generated optical power to an optical detector which is physically separated from the amplifier. While a separate detector is adequate, it is desirable to have a photodetector which is integrated with an optical amplifier on the same semiconductor chip. Integration of an optical amplifier with a photodetector on the same chip can result in an optical amplifier photodetector device which has reduced size, can operate with increased speed, can provide high performance and have good reliability, and may eliminate substantial costs incurred in packaging the separated devices.

SUMMARY OF THE INVENTION

In the invention, an optical amplifier and a photodetector are integrated on the same semiconductor chip, the photodetector being optically coupled to the optical amplifier via an integrated waveguide. An optical grating can be used to enhance the coupling of optical energy from the waveguide to the photodetector. The photodetector is spatially positioned relative to the optical amplifier to prevent optical energy not present in the waveguide from reaching the photodetector. The waveguide is positioned to couple a small fraction of the energy from the optical amplifier to the phtotdetector. In operation, the waveguide redirects a small portion of the electromagnetic energy from the optical amplifier to the photodetector for monitoring the average output power of the optical amplifier. The offset position of the photodetector relative to the optical amplifier enables the photodetector to monitor the output power of the optical amplifier without degrading the performance of the optical amplifier.

BRIEF DESCRIPTION OF THE DRAWING

A more complete understanding of the invention may be obtained by reading the following description of a specific illustrative embodiment of the invention in conjunction with the appended drawings in which:

FIG. 1 is a sectional view of an integrated optical amplifier-waveguide structure in accordance with the principles of the invention.

FIG. 2 is a sectional view of an integrated optical amplifier-waveguide-photodetector structure in accordance with the principles of the invention;

FIG. 3 is a sectional view of an integrated optical amplifier-waveguide-photodetector structure having an absorbing layer in accordance with the principles of the invention; and FIG. 4 is a sectional view of an integrated optical amplifier-waveguide-photodetector structure havihng an optical grating in accordance with the principles of the invention.

DETAILED DESCRIPTION

Optical amplifiers can be used in long-haul optical fiber transmission systems where the information that is being transmitted is represented by encoded light beams which propagate through glass fibers. For error-free transmission, the intensity of the transmitted light should be maintained within a predetermined range. This is normally accomplished by diverting some of the light from the optical amplifier to a monitoring photodetector. The optical amplifier and the photodetector are separate and distinct from each other and are normally coupled via an optical fiber coupler. The monitoring photodetector measures the average power output of the optical amplifier. The signal generated by the photodetector can be used to control a feedback circuit coupled to adjust the average power output of the optical amplifier within a desired predetermined range. This control of the output power of the optical amplifier is necessary because the output power can change slowly over a period of time as a result of aging, slow degradation of the optical amplifier or large variations of ambient temperature.

Although a separate monitoring photodetector is adequate for many applications, it is desirable to have the photodetector and the optical amplifier integrated on the same semiconductor chip.

In this invention, a new improved optical amplifier photodetector structure is disclosed where the optical amplifier and the photodetector are integrated on the same semiconductor chip and the photodetector is optically coupled to the optical amplifier via an integrated waveguide. The photodetector can be coupled to the waveguide either directly or via an optical grating. With this invention, only a small fraction of the output power of the optical amplifier needs to be diverted to the photodetector to monitor the output power of the optical amplifier.

Generally, the integration of optics with an active component such as an optical amplifier relies on the ability to guide light from one device to the next without undue loss. Most approaches to achieve this involve a different layer structure in the passive and active regions established by intermediate etching of layers during the crystal growth sequence. Different layer structures are usually required since mode overlap with an active layer is required to obtain gain or absorption in the active region, but this same active layer, if not pumped, produces loss at the wavelength of interest in the passive region. This problem may be reduced somewhat in quantum well structures, but not to the degree required for many device configurations. Since the passive and active sections have different layer structures, one is actually butt coupled with an attempt to obtain maximum mode matching through proper design of the layer structures.

Referring to FIG. 1, there is illustrated an active-passive transition structure which can serve to carry optical energy from a first region which can include an optical amplifier to a second region 8 which can include a photodetector. In the various FIGS., similar parts have similar reference numerals throughout the various views.

In FIG. 1, an optical amplifier or gain layer 12 can be comprised of InGaAs/InGaAsP with a composition chosen to provide optical gain at approximately 1.5 um. Alternatively, layer 12 may be comprised of an InGaAs/InGaAsP multiple quantum well stack having InGaAs layers of substantially 80 Å thickness and InGaAsP barriers of substantially 100 Å thickness to provide gain at approximately 1.5 um. The passive waveguide core 14 can be 1.3 um bandgap InGaAsP. An upper cladding 16 can be P+ InP and an electrical contact layer 18 of P++ InGaAs can be positioned on top. A lower cladding layer 21 and substrate 22 can be composed on n+ InP.

The removal of the active layer 12 from a section of the passive region can be achieved by the use of an etch-stop layer. An isolation groove 20 etched through the contact layer 18 provides electrical isolation between the first region 6 and the second region 8. If desired, instead of etching the groove 20 through the contact layer 18, electrical isolation can be obtained by replacing a portion of the entire upper cladding region with semi-insulating InP.

To complete the device, a photodetector is coupled to the second region 8 to strip-off only a small portion of the optical energy present in the waveguide. In the embodiment disclosed, the photodetector is not forward biased and, therefore, electrical isolation between the active area and the passive area is desirable. The photodetector absorption layer can be positioned in the second region adjacent to the waveguide or connected directly to the waveguide.

Referring to FIG. 2, there is illustrated the structure of FIG. 1 including a photodetector coupled to the second region 8. The structure of FIG. 2 has a detector which is just in the wings of the mode profile with only a small fraction of the mode energy reaching the detector absorbing layer. The layer 16 of FIG. 1 in the second region is removed by the use of a material selective etchant and an n-InP layer 24 is grown by metal organic chemical vapor deposition (MOCVD) or the like. A p layer 26 of P-InGaAs is then grown on top of layer 24, the junction 28 of layers 24, 26 forming a p-n junction. The wafer is then processed to form an optical amplifier in the first region 6 and a photodetector in the second region 8. In operation, optical energy generated by the optical amplifier travels along the waveguide core 14 past the photodetector. As it passes the photodiode, a small portion of the energy of the mode intensity distribution is detected by the photodiode and a signal is generated.

In another embodiment, a thin absorption layer can be included in the second region. The structure of FIG. 3 is similar to that of FIG. 2 with the addition of a thin absorption layer 30 and a p-InP layer 32 positioned between the n-InP layer 24 and the p-InGaAs layer 26. A thin layer with its thickness and spatial position chosen to have a mode confinement factor of approximately 0.5% will provide approximately 5% absorption in a 200 um length, assuming 500 cm$^{-1}$ absorption in the thin layer. The wafer is then processed to provide an optical amplifier in the first region 6 and a photodetector in the second region 8 using standard metallization and photolithographic techniques.

In still another embodiment as illustrated in FIG. 4, a diffraction grating is used to direct or deflect a small amount of light from the passive waveguide to the photodetector. The structure of FIG. 4 is similar to that of FIG. 2 with the addition of a layer 34 of undoped InGaAs being located between layer 24 of n-InP and layer 26 of p-InGaAs; and a small amplitude or weak near 2nd order grating is formed on the waveguide 14 to cause a small amount of optical energy in the waveguide to be diffracted upward toward the photodetector. A 2nd order grating is defined as $\lambda g = 2 pi/\beta$ where $\lambda g$ is the pitch of the grating and $\beta$ is the propagation constant of the mode in the passive waveguide. The term "near 2nd order grating" as used herein means that there is a deviation from the exact 2nd order value which is sufficient to prevent back-reflections along the passive guide within a wavelength range equal to the gain bandwidth of the amplifier gain medium. This deviation will prevent the amplifier from oscillating, i.e., becoming a laser. The pitch of the grating can be as low as $\frac{1}{2}$ the value of $\lambda g$ or as high as 2 times the value of $\lambda g$. The wafer is processed to provide an optical amplifier in the first region 6 and a photodetector in the second region 8 using standard metallization and photolithographic techniques. The term "near" 2nd order grating is used to indicate that the grating is not a true 2nd order grating because a 2nd order grating can cause oscillation by reflecting optical energy back along the waveguide. The pitch of the grating can, in fact, significantly deviate from the second order value, and only the angle of the diffraction out of the passive waveguide core will be changed. As long as the diffracted light is such a way as to be intercepted by the absorption layer of the photodetector, the grating will function as desired. In operation, the vertically diffracted light from the near second order grating is absorbed in the undoped InGaAs layer 34. Good absorption will be obtained when layer 34 is $\frac{1}{2}$1 um.

The device here disclosed comprises an optical amplifier coupled to direct optical energy into a passive waveguide for transmission through the waveguide to its other end. A photodetector, positioned relative to the passive waveguide, detects the presence of optical energy in the passive waveguide. The photodetector in the structure illustrated is positioned downstream from the optical amplifier and spatially positioned with respect to the optical amplifier to receive optical energy only from the waveguide. In this invention the photodetector does not receive optical energy directly from the optical amplifier. A small fraction of the optical energy in the passsive waveguide is received by the photodetector. The output signal from the photodetector can be used to monitor the output of the optical amplifier to provide, with a feedback circuit, stabilization or control of the optical amplifier with minimum adverse effect on the output power of the optical amplifier.

It is to be understood that the above described invention is not limited to an optical amplifier, but can also be used with other devices. Regardless of the specific device used, it is important to be able to monitor and control the output power of the device. Clearly, device structures that incorporate a detector on the same chip as an optical amplifier or the like are important because such integrated devices can provide the full benefits which result from integration such as compactness, increased reliability, decreased cost, reduced number of components, and better performance.

We claim:

1. A device comprising a passive waveguide, an optical amplifier coupled to direct optical energy into a first end of said passive waveguide for transmission along the passive waveguide to its other end, a photodetector comprising a layer of n-InP and a layer of p-InGaAs offset laterally from said passive waveguide positioned downstream from said optical amplifier and upstream from said other end, and a diffraction grating coupled to a side of said passive waveguide to direct substantially perpendicularly a portion of the optical energy passing through the passive waveguide toward said other end toward said photodetector, said waveguide comprising a cladding having an isolation section upstream of said photodetector, said optical amplifier, passive waveguide and photodetector being integrated on a common chip.

2. The device of claim 1 characterized in that said near second order diffraction grating has a pitch which can be as low as 0.5 that of a second order grating or as high as 2 times that of a second order grating.

* * * * *